United States Patent
Yamada et al.

(10) Patent No.: US 6,987,346 B2
(45) Date of Patent: Jan. 17, 2006

(54) ENERGY TRAP TYPE PIEZOELECTRIC RESONATOR COMPONENT

(75) Inventors: Mitsuhiro Yamada, Takaoka (JP);
Masakazu Yoshio, Toyama-ken (JP);
Kenichi Kotani, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/801,151

(22) Filed: Mar. 16, 2004

(65) Prior Publication Data

US 2004/0245892 A1 Dec. 9, 2004

(30) Foreign Application Priority Data

| Jun. 3, 2003 | (JP) | ............................. 2003-158245 |
| Dec. 9, 2003 | (JP) | ............................. 2003-410355 |
| Jan. 19, 2004 | (JP) | ............................. 2004-010663 |

(51) Int. Cl.
  *H01L 41/08* (2006.01)
  *H02N 2/00* (2006.01)

(52) U.S. Cl. ..................... 310/320; 310/365; 310/366
(58) Field of Classification Search ......... 310/320.365, 310/358, 344, 348
See application file for complete search history.

(56) References Cited

U.S. PATENT DOCUMENTS 6,232,699 B1 * 5/2001 Wajima ..................... 310/320

FOREIGN PATENT DOCUMENTS

| JP | 08-148967 | 6/1996 |
| JP | 10-178329 | 6/1998 |
| JP | 11-168343 | 6/1999 |
| JP | 2003-087077 | 3/2003 |

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

An energy trap type piezoelectric resonator component includes a piezoelectric resonator using a third overtone of a thickness longitudinal vibration. The piezoelectric resonator includes a piezoelectric substrate, and first and second vibrating electrodes, having an elliptical shape, and respectively arranged on portions of first and second major surfaces of the piezoelectric substrate such that the first and second vibrating electrodes face each other with the piezoelectric substrate interposed therebetween. A flattening ratio "a/b" of a minor axis diameter "b" to a major axis diameter "a" of the elliptical shape is within a range of from about 1.2 to about 1.45. The resonator is thus compact, effectively controls the fundamental wave of the thickness longitudinal vibration as a spurious wave, is relatively free from area restraints of the electrode and dimensional constraints, and meets a variety of frequency requirements in a wide range.

12 Claims, 14 Drawing Sheets

ENERGY TRAP TYPE PIEZOELECTRIC RESONATOR COMPONENT

BACKGROUND OF THE INVENTION

1. Field of the Invention

The present invention relates to energy trap type piezoelectric resonator components and, in particular, to an energy trap type piezoelectric resonator component having a structure that suppresses a fundamental wave of a thickness longitudinal vibration and that uses harmonics of the thickness longitudinal vibration.

2. Description of the Related Art

Energy trap type piezoelectric resonators are in widespread use as an oscillator or a resonator. A variety of vibration modes are selectively used depending on a target frequency.

Japanese Unexamined Patent Application Publication No. 11-168343 discloses an energy trap type piezoelectric resonator that uses a third overtone of a thickness longitudinal vibration mode. FIGS. 12 and 13 are respectively a perspective view and a plan view of the disclosed piezoelectric resonator 101.

A piezoelectric resonator 101 includes a parallelepiped piezoelectric substrate 102. Vibrating electrodes 103 and 104, each having a circular planar shape, are respectively arranged on the center of the top surface and the center of the bottom surface of the piezoelectric substrate 102. Extension electrodes 105 and 106 are respectively connected to the vibrating electrodes 103 and 104. The vibrating electrodes 103 and 104 face each other with the piezoelectric substrate 102 interposed therebetween. The piezoelectric substrate 102 is polarized in the direction of thickness.

If an alternating electric field is applied between the vibrating electrodes 103 and 104, the piezoelectric resonator 101 is vibrated in a thickness longitudinal vibration mode. The piezoelectric resonator 101 uses a third overtone of the thickness longitudinal vibration. Desired resonance characteristics are thus obtained.

When the thickness longitudinal vibration occurs, the fundamental wave thereof is also generated in addition to the third overtone. If the third overtone is desired, the fundamental wave becomes a spurious. For this reason, the line width of each of the extension electrodes 105 and 106 is selected in the piezoelectric resonator 101 to arrange a spurious control electrode for controlling the fundamental wave.

FIG. 14 is a plan view illustrating a piezoelectric resonator 111, using the third overtone of the thickness longitudinal vibration, disclosed in Japanese Unexamined Patent Application Publication 10-178329. The piezoelectric resonator 111 includes a parallelepiped piezoelectric substrate 112. A vibrating electrode 113 having an elliptical shape is disposed in the center of the top surface of the piezoelectric substrate 112. A vibrating electrode having an elliptical shape is arranged on the center of the bottom surface of the piezoelectric substrate 112. The vibrating electrodes 113 on both major surfaces of the piezoelectric substrate 112 face each other with the piezoelectric substrate 112 interposed therebetween.

Let $L_1$ represent the major axis diameter of the vibrating electrode 113, and let $L_2$ represent the minor axis diameter of the vibrating electrode 113, and the ratio of $L_1/L_2$ falls within a range of 1.10 to 1.75. An extension electrode 114 is connected to the elongated side of the vibrating electrode 113. The line width of the extension electrode 114 is 0.9 to 1.1 times the major axis diameter $L_1$ of the vibrating electrode 113. Harmonics of expanding vibration different from the thickness longitudinal vibration are positively excited. The harmonics of the expanding vibration are superimposed on the fundamental wave of the thickness longitudinal vibration to suppress the fundamental wave.

In the piezoelectric resonator 101 disclosed in Japanese Unexamined Patent Application Publication No. 11-168343, a spurious control section is arranged in the extension electrodes 105 and 106. The fundamental wave is suppressed by intentionally enlarging the fundamental wave of the thickness longitudinal vibration in the spurious control section and then suppressing the fundamental wave in an encapsulation section.

In the piezoelectric resonator 111 disclosed in Japanese Unexamined Patent Application Publication 10-178329, the fundamental wave of the thickness longitudinal vibration is suppressed by superimposing the harmonics of the expanding vibration on the fundamental wave.

In each of these known devices, the area of the vibrating electrode is not increased in the structure for suppressing the fundamental wave of the thickness longitudinal vibration under the limitation that the third overtone in use is not suppressed. When an attempt is made to achieve a variety of frequency resonance characteristics by increasing the area of the vibrating electrode, the fundamental wave of the thickness longitudinal vibration is not sufficiently suppressed.

SUMMARY OF THE INVENTION

In order to overcome the problems described above, preferred embodiments of the present invention provide a compact energy trap type piezoelectric resonator component which not only effectively suppresses the fundamental wave of a thickness longitudinal vibration functioning as a spurious wave, in the use of a third overtone of the thickness longitudinal vibration, but also easily achieves desired resonance characteristics with few, if any, limitations on the area of an electrode and dimensions of a piezoelectric substrate.

According to a preferred embodiment of the present invention, an energy trap type piezoelectric resonator component utilizing third overtone of a thickness longitudinal vibration includes an energy trap piezoelectric resonator element including a piezoelectric substrate having first and second major surfaces and polarized in a direction of thickness between the first and second major surfaces, a first vibrating electrode disposed on a portion of the first major surface of the piezoelectric substrate, and a second vibrating electrode disposed on a portion of the second major surface of the piezoelectric substrate and facing the first vibrating electrode with the piezoelectric substrate interposed therebetween. Each of the first and second vibrating electrodes has a substantially elliptical shape, and a flattening ratio "a/b" is within a range of about 1.2 to about 1.45 where "a" represents the major axis diameter of the substantially elliptical shape and "b" represents the minor axis diameter of the substantially elliptical shape. The energy trap piezoelectric resonator component further includes first and second casing substrates respectively laminated on the top and bottom of the piezoelectric substrate, wherein vibrating cavities are provided between the first vibrating electrode and the first casing substrate and between the second vibrating electrode and the second casing substrate.

In the energy trap type piezoelectric resonator component of a preferred embodiment of the present invention, each of the first and second vibrating electrodes preferably has the substantially elliptical shape, and the flattening ratio "a/b" is within the range of about 1.2 to about 1.45 where "a"

represents the major axis diameter of the substantially elliptical shape and "b" represents the minor axis diameter of the substantially elliptical shape. The fundamental wave of the thickness longitudinal vibration vibrates more greatly in the lateral portion of the vibrating electrode. By encapsulating a portion where the fundamental wave of the thickness longitudinal vibration vibrates with greater amplitude, the fundamental wave of the thickness longitudinal vibration is effectively controlled without affecting the vibration of the third overtone of the thickness longitudinal vibration.

The energy trap type piezoelectric resonator component using the third overtone of the thickness longitudinal vibration and having good resonance characteristics is thus provided. Since dimensional constraints are not strict, energy trap type piezoelectric resonator components having operating frequencies in a wide range are provided. The energy trap type piezoelectric resonator component is also miniaturized.

Preferably, each of the first and second major surfaces has a substantially rectangular shape defined by a pair of longer sides and a pair of shorter sides and the minor axis of the substantially elliptical shape of each of the first and second vibrating electrodes is substantially parallel with the short side of the piezoelectric substrate.

When each of the first and second major surfaces has the substantially rectangular shape defined by a pair of longer sides and a pair of shorter sides and the minor axis of the substantially elliptical shape of each of the first and second vibrating electrodes is substantially parallel with the shorter side of the piezoelectric substrate, the fundamental wave of the thickness longitudinal vibration is excited more strongly from the vibrating electrode to the external portion of the piezoelectric substrate along the direction of the shorter side of the piezoelectric substrate. By encapsulating the strongly excited portion of the fundamental wave of the thickness longitudinal vibration, the fundamental wave of the thickness longitudinal vibration is effectively suppressed.

Preferably, the energy trap type piezoelectric resonator component further includes a first extension electrode connected to the first vibrating electrode on the first major surface of the piezoelectric substrate and extending toward the periphery of the first major surface, and a second extension electrode connected to the second vibrating electrode on the second major surface of the piezoelectric substrate and extending toward the periphery of the second major surface, wherein the line width of each of the first and second extension electrodes is narrower than the minor axis diameter of each of the first and second vibrating electrodes.

If the line width of each of the first and second extension electrodes is narrower than the minor axis diameter of each of the first and second vibrating electrodes in the energy trap type piezoelectric resonator component of a preferred embodiment of the present invention, unnecessary overlapping portions of the extension electrodes are minimized. This arrangement suppresses a spurious vibration generated in an area where the third overtone occurs.

Preferably, the first and second casing substrates have recesses on the surfaces thereof facing the energy trap type piezoelectric resonator to ensure that the vibration of a vibrating section having the first and second vibrating electrodes facing each other is not restricted.

The first and second casing substrates have the recesses on the respective surfaces thereof facing the energy trap type piezoelectric resonator to ensure that the vibration of a vibrating section having the first and second vibrating electrodes facing each other is not restricted. As a result, the vibration of the vibrating section is not restricted. The fundamental wave of the thickness longitudinal vibration is effectively suppressed by the encapsulation portion without affecting the third overtone of the thickness longitudinal vibration. An energy trap type piezoelectric resonator component having good resonance characteristics is thus provided.

Preferably, the energy trap type piezoelectric resonator component further includes a first adhesive layer between the first casing substrate and the piezoelectric resonator, and a second adhesive layer between the second casing substrate and the piezoelectric resonator, wherein the first and second adhesive layers respectively bond the first and second casing substrates to the piezoelectric resonator, and wherein each of the first and second adhesive layers has a substantially rectangular frame and a vibrating section where the first and second vibrating electrodes face each other is arranged within cavity portions of the substantially rectangular frame outlines.

The first and second casing substrates are bonded to the energy trap type piezoelectric resonator via the first and second adhesive layers, respectively, in a preferred embodiment of the present invention. If a recess is the opening of the substantially rectangular frame, the opening of the substantially rectangular frame of the adhesive layer forms a cavity within which the vibration of the vibrating section is not restricted. The fundamental wave of the thickness longitudinal vibration is effectively suppressed by the encapsulation portion without affecting the third overtone of the thickness longitudinal vibration. An energy trap type piezoelectric resonator component having good resonance characteristics is thus provided.

The energy trap type piezoelectric resonator component of preferred embodiments of the present invention has a structure in which the cavity is formed by the recess or the opening of the adhesive layer. A location where the fundamental wave of the thickness longitudinal vibration greatly vibrates is encapsulated by the adhesive layer. The fundamental wave of the thickness longitudinal vibration is effectively suppressed, resulting in good resonance characteristics.

Preferably, the energy trap type piezoelectric resonator component further includes a frame-shaped damping member arranged on the periphery of at least one of the major surfaces of the piezoelectric substrate.

If a frame-shaped damping member is arranged on the periphery of at least one of the major surfaces of the piezoelectric substrate, the damping member scatters, and attenuates the fundamental wave of the thickness longitudinal vibration, thereby effectively suppressing the fundamental wave of the thickness longitudinal vibration.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The preferred embodiments of the present invention are described below with reference to the drawings.

Figure 1:
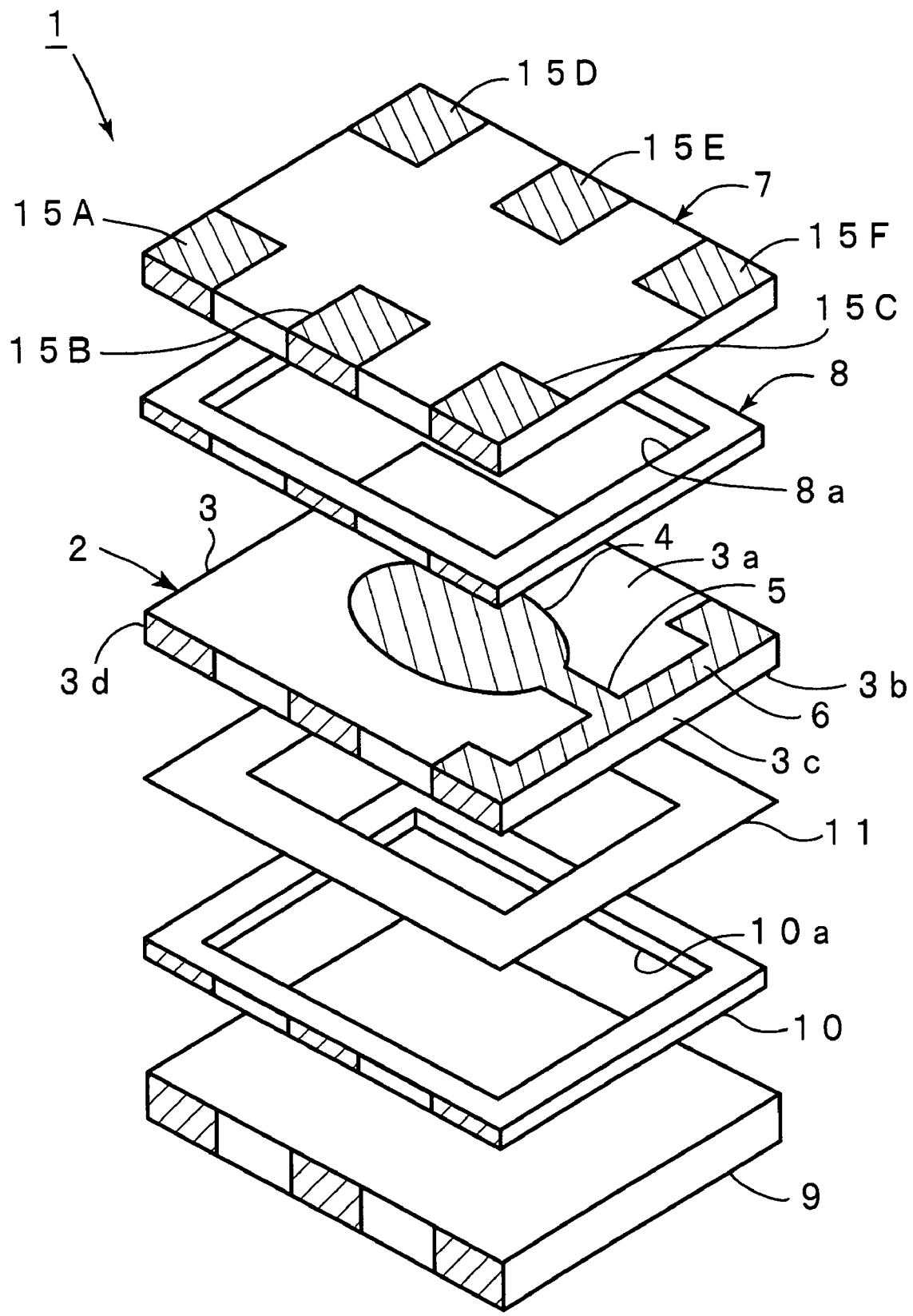
FIG. 1 is an exploded perspective view illustrating an energy trap type piezoelectric resonator component in accordance with a first preferred embodiment of the present invention.

FIG. 1 is an exploded perspective view illustrating an energy trap type piezoelectric resonator component 1 in accordance with a first preferred embodiment of the present invention. The piezoelectric resonator component 1 includes an energy trap type piezoelectric resonator 2.

The energy trap type piezoelectric resonator 2 includes a piezoelectric substrate 3 preferably having a substantially rectangular shape in plan view. The piezoelectric substrate 3 is preferably made of a piezoelectric ceramic such as a lead titanate ceramic. The piezoelectric substrate 3 is polarized in a direction of thickness between first and second major surface 3a and 3b.

The first major surface 3a preferably has a substantially rectangular shape defined by a pair of longer sides and a pair of shorter sides. The second major surface 3b preferably has substantially the same shape as the first major surface 3a.

A first vibrating electrode 4 having a substantially elliptical shape in plan view is disposed in the center of the first major surface 3a. As second vibrating electrode having the same substantially elliptical shape is also disposed in the second major surface 3b of the piezoelectric substrate 3. The first and second vibrating electrodes 4 face each other with the piezoelectric substrate 3 interposed therebetween.

A first extension electrode 5 is connected to the first vibrating electrode 4. The first extension electrode 5 extends to the periphery of the first major surface 3a, in the first preferred embodiment, to one shorter side of the first major surface 3a. The first extension electrode 5 is connected to a connection electrode 6 that extends along the shorter side of the first major surface 3a.

The connection electrode 6 extending along the shorter side of the first major surface 3a has both end portions that partially extend along the longer sides of the first major surface 3a.

Furthermore, a second extension electrode connected to the second vibrating electrode, and a second connection electrode connected to the second extension electrode are arranged on the second major surface 3b of the piezoelectric substrate 3. The second extension electrode and the second connection electrode are arranged close to an end surface 3d opposite from an end surface 3c of the piezoelectric substrate 3.

In accordance with the first preferred embodiment of the present invention, the first vibrating electrode 4, the first extension electrode 5, the first connection electrode 6, and the second vibrating electrode, the second extension electrode and the second connection electrode arranged on the second major surface 3b are preferably made of an alloy containing nickel (Ni), chromium (Cr), and silver (Ag). However, the present invention is not limited to any particular electrode material. These electrodes are preferably manufactured using a thin film forming method such as deposition or sputtering technique, or other suitable process.

An adhesive layer 8 is laminated on top of the energy trap type piezoelectric resonator 2 and a first casing substrate 7 is bonded to the first casing substrate 7. On the bottom side of the energy trap type piezoelectric resonator 2, a second casing substrate 9 is bonded to the energy trap type piezoelectric resonator 2 with a substantially rectangular adhesive layer 10 and a substantially rectangular damping member 11 interposed therebetween. The first and second casing substrates 7 and 9 have a planar structure. The first and second casing substrates 7 and 9 are made of an appropriate ceramic such as an insulating ceramic or a synthetic resin.

The adhesive layers 8 and 10 are made of an appropriate bonding agent such as an epoxy resin based bonding agent. The adhesive layers 8 and 10 have a substantially rectangular frame structure having openings 8a and 10a, respectively. The openings 8a and 10a are formed to create cavities that cause a vibrating section including the mutually facing the first vibrating electrode 4 and second vibrating electrode to be free from restriction in the vibration action thereof.

The damping member 11 is preferably made of an epoxy resin or other suitable material. The damping member 11 is preferably made of a material that has a higher elastic modulus than that of the adhesive layers 8 and 10, and has the function of scattering and attenuating the fundamental wave of the thickness longitudinal vibration. To scatter and attenuate the fundamental wave of the thickness longitudinal vibration, the damping member 11 and the adhesive layer 10 preferably have a total thickness of about $\lambda/4$ where $\lambda$ represents the wavelength of the fundamental wave of the thickness longitudinal vibration. In the first preferred embodiment of the present invention, the damping member 11 preferably has a thickness of about 40 μm or more, for example. The fundamental wave is generated on both surfaces of the piezoelectric substrate. To effectively suppress each fundamental wave, the damping member 11 is preferably arranged on both surfaces. Even when the damping member 11 is arranged on a single side only as in the first preferred embodiment of the present invention, the fundamental wave of the thickness longitudinal vibration is still effectively suppressed on the single surface.

Electrode layers 15A–15C and 15D–15F arranged on the side surfaces of the casing substrates and the piezoelectric substrate 3 as hatched as shown in FIG. 1 are used for connection with external circuit. Since the piezoelectric resonator component 1 is shown as being exploded in FIG. 1, portions of the electrode layers 15A–15C are shown segmented on the side surfaces of the casing substrates and the piezoelectric substrate 3.

One of the unique features of the piezoelectric resonator component 1 of the first preferred embodiment of the present invention is that the first and second vibrating electrodes have a substantially elliptical shape, and that a flattening ratio "a/b" is within a range of about 1.2 to about 1.45 where "a" represents the major axis diameter of the substantially elliptical shape and "b" represents the minor axis diameter of the substantially elliptical shape. With this arrangement, the fundamental wave of the thickness longitudinal vibration is effectively suppressed. A specific example will now be discussed.

Figure 2:
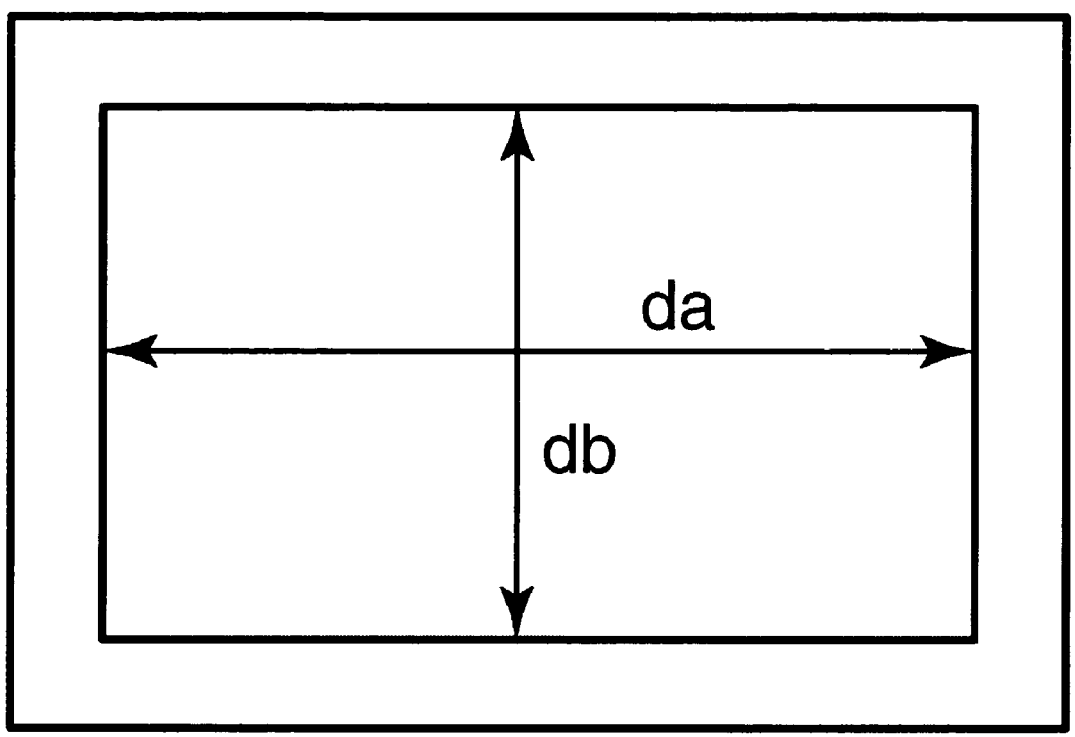
FIG. 2 is a plan view illustrating dimensions of a cavity that keeps a vibrating section from being restricted in the piezoelectric resonator component in accordance with the first preferred embodiment of the present invention.
Figure 3:
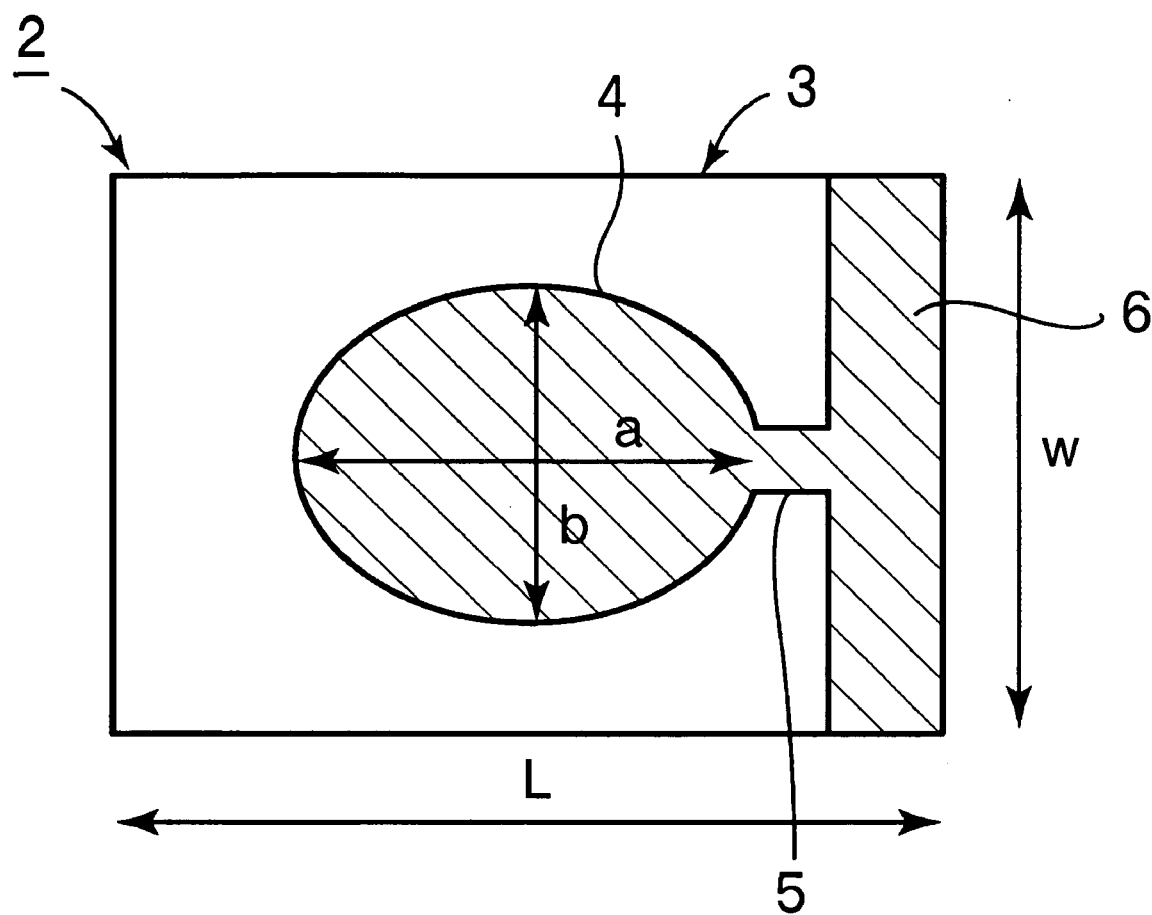
FIG. 3 is a plan view illustrating the piezoelectric resonator in accordance with the first preferred embodiment of the present invention.

As an example of the piezoelectric substrate 3 of the energy trap type piezoelectric resonator 2, a piezoelectric substrate made of lead titanate ceramic and having approximate dimensions of, for example, length L of about 2.5 mm by a width W of about 2.0 mm by a thickness of about 0.23 mm was prepared. As diagrammatically shown in FIG. 3, the first and second vibrating electrodes having a major axis diameter "a" of about 1.00 mm and a minor axis diameter "b" of about 0.75 mm and having a flattening ratio of "a/b" of about 1.33 were produced. The adhesive layers 8 and 10 had an opening with a longer side "da" of about 2.10 mm and a shorter side "db" of about 1.60 mm as shown in FIG. 2. The thickness of the adhesive layers 8 and 10 was about 0.05 mm. The damping member 11 in plan view had an opening with a long side "da" of about 1.90, a short side "db" of about 1.20 mm, and a thickness of about 0.05 mm.

A comparative piezoelectric resonator component was prepared to be compared with the piezoelectric resonator component 1. The comparative piezoelectric resonator component having a vibrating electrode area S of about 0.59 $mm^2$ was identical to the piezoelectric resonator component 1 except that the shape of the vibrating electrode was circular. Resonance characteristics of the piezoelectric resonator component 1 and the comparative piezoelectric resonator component were measured.

Figure 4:
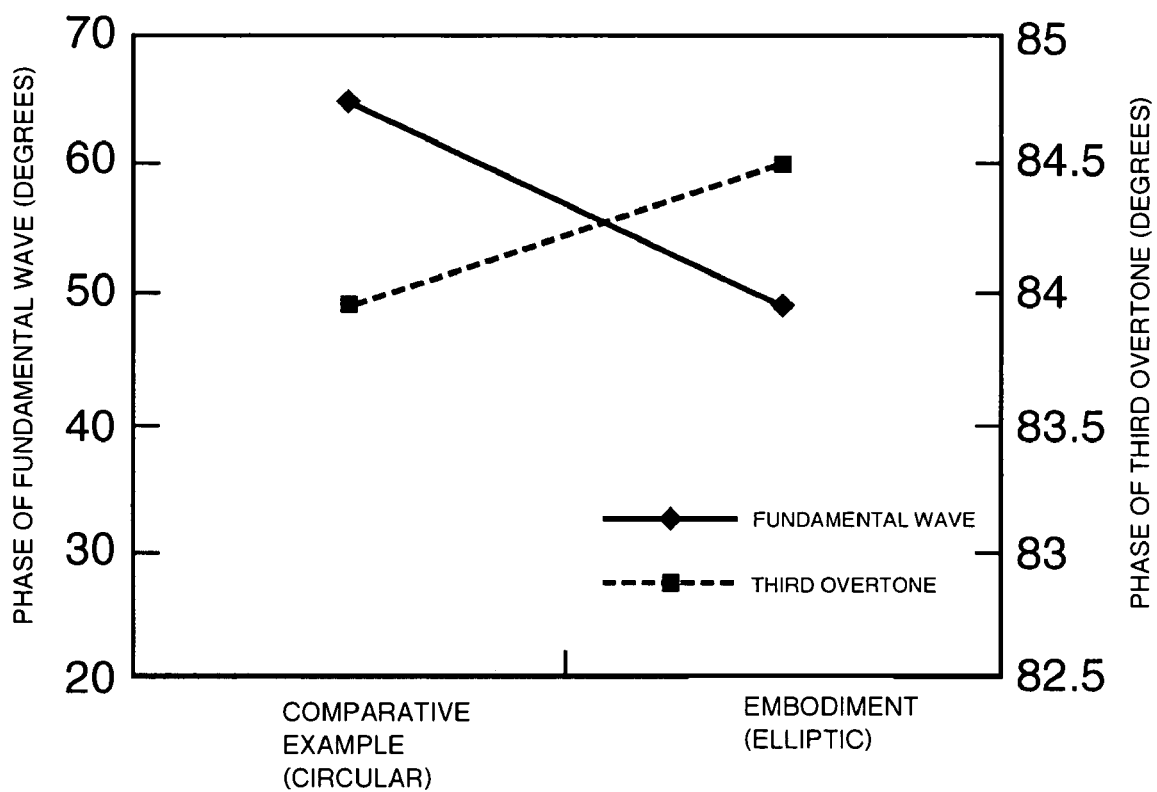
FIG. 4 is a graph plotting the maximum values of the phases of the fundamental wave and the third overtone of a thickness longitudinal vibration in a comparative piezoelectric resonator component including circular vibrating electrodes and the piezoelectric resonator component in accordance with the first preferred embodiment of the present invention.

FIG. 4 is a graph plotting the maximum values of the phases of the fundamental wave and the third overtone of the thickness longitudinal vibration in the comparative piezoelectric resonator device and the piezoelectric resonator device 1.

As clearly shown in FIG. 4, the comparative piezoelectric resonator component having the circular vibrating electrode results in the maximum value of the phase of the fundamental wave substantially larger than the maximum value of the phase of the third overtone. In contrast, the piezoelectric resonator component 1 of the first preferred embodiment of the present invention achieves the maximum value of the phase of the third overtone substantially larger than the maximum value of the fundamental wave. According to the test results, the piezoelectric resonator component 1 effectively suppresses the fundamental wave of the thickness longitudinal vibration, thereby effectively taking advantage of the resonance characteristics of the third overtone in use.

The reason why the first preferred embodiment provides such an effect is that the use of the first and second vibrating electrodes having the substantially elliptical shape changes the behavior of the vibration of the fundamental wave of the thickness longitudinal vibration in the direction of the minor axis of the vibrating electrode. More specifically, the fundamental wave is considered to have a large displacement in the direction of thickness close to an encapsulation portion of the adhesive layer while the third overtone is free from the problem not having large changes in displacement even with the substantially elliptical shape of the vibrating electrode.

The inventors of the present invention analyzed the displacement using finite element method concerning the vibration behavior of the piezoelectric resonator component 1 of the first preferred embodiment and the comparative piezoelectric resonator component.

Figure 5:
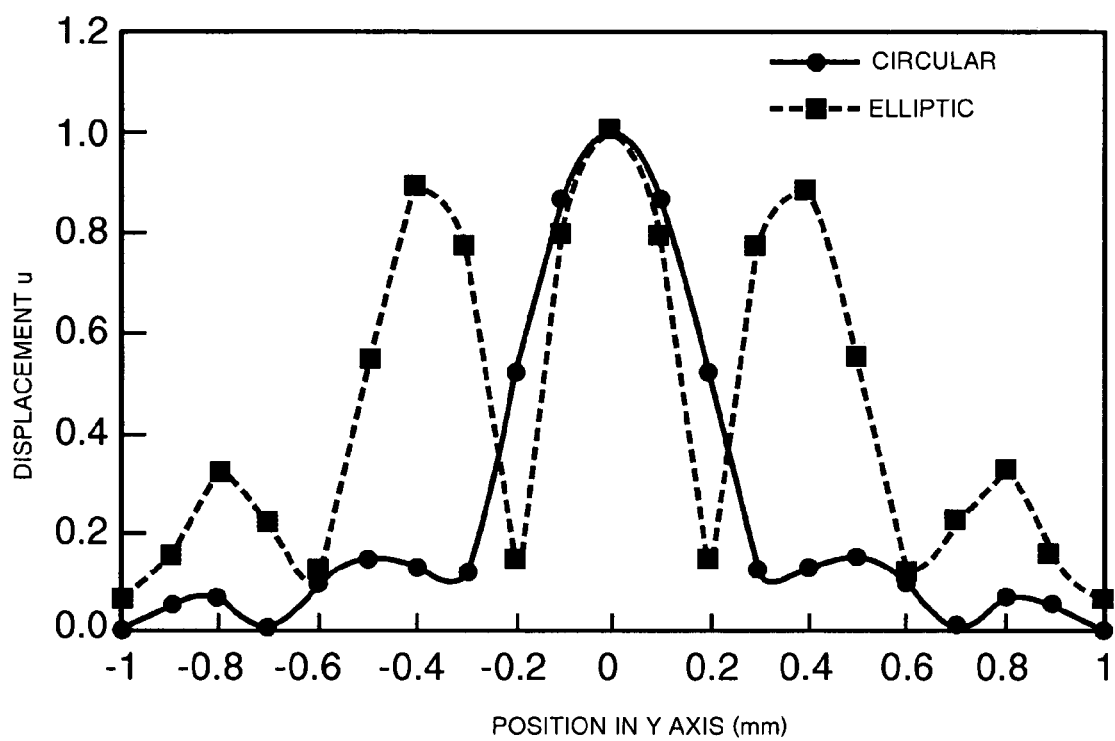
FIG. 5 is a graph plotting the distribution of displacements of the fundamental wave of the thickness longitudinal vibration in a Y direction in parallel with the shorter side of a piezoelectric substrate passing through the center of the vibrating electrode in each of the piezoelectric resonator component of the first preferred embodiment and the comparative piezoelectric resonator component.
Figure 6:
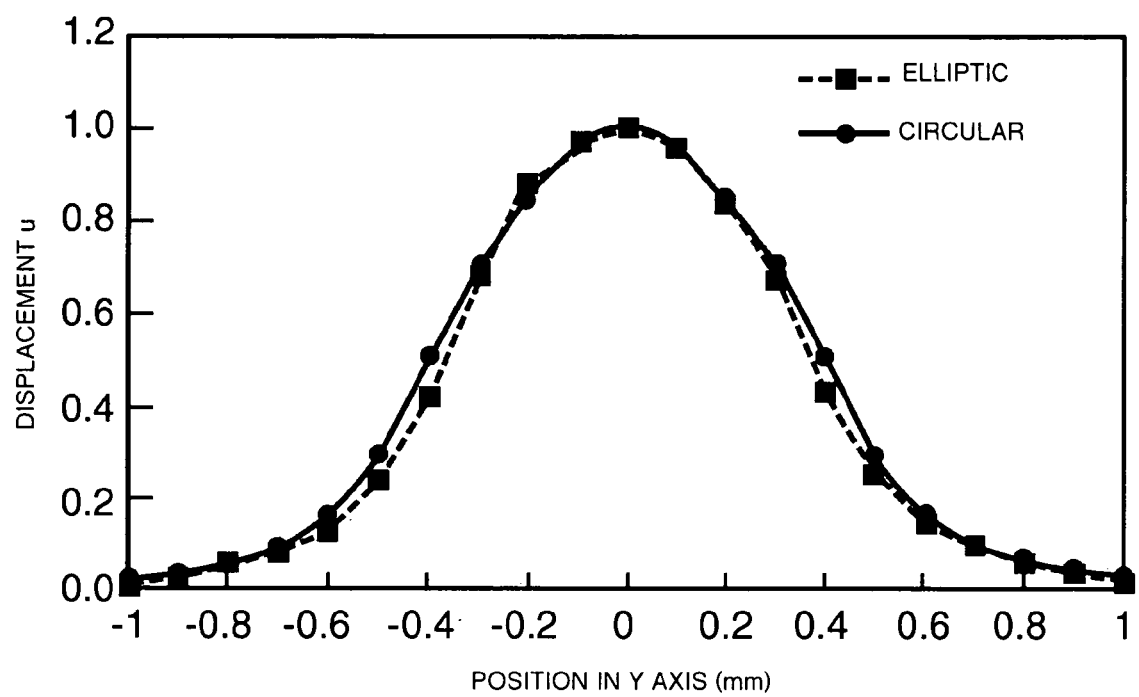
FIG. 6 is a graph plotting the distribution of displacements of the third overtone of the thickness longitudinal vibration in a Y direction in parallel with the shorter side of a piezoelectric substrate passing through the center of the vibrating electrode in each of the piezoelectric resonator component of the first preferred embodiment and the comparative piezoelectric resonator component.
Figure 7:
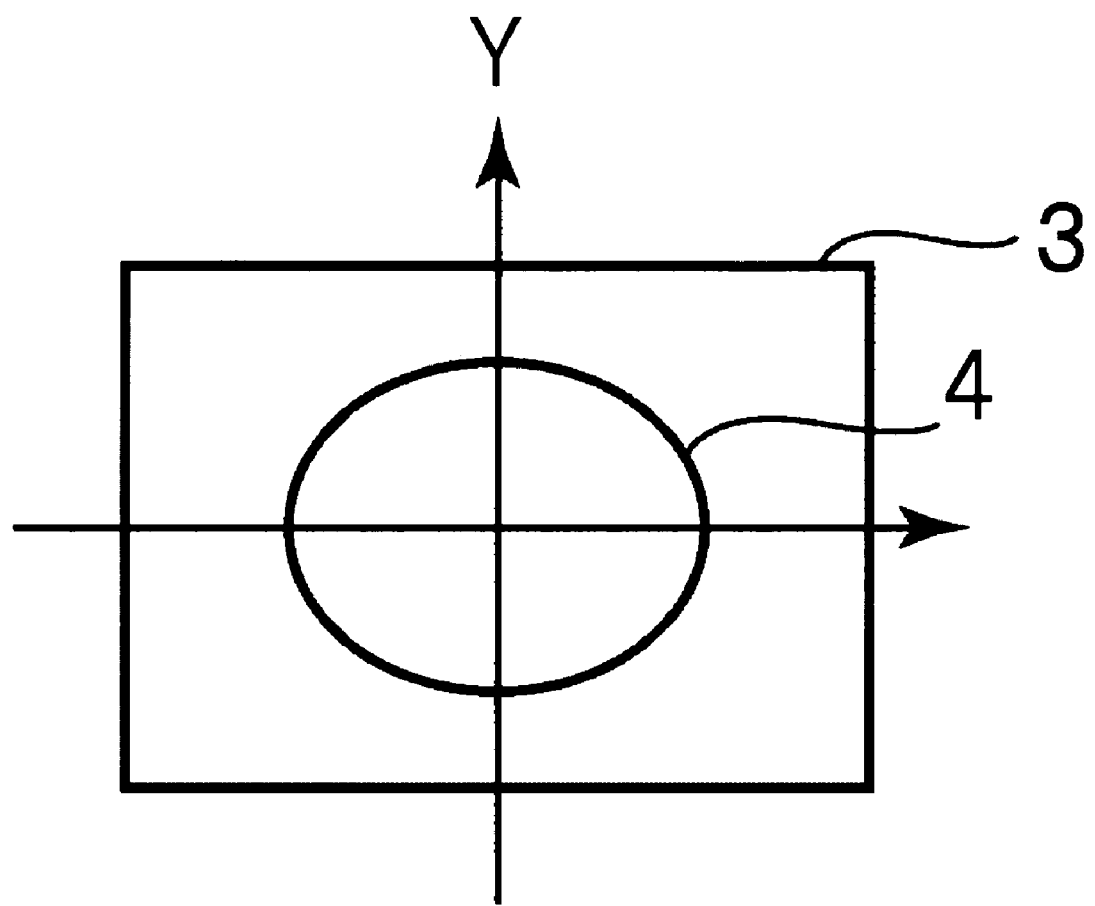
FIG. 7 is a diagrammatical plan view of the vibrating electrode illustrating the meaning of the direction of the Y axis illustrated in FIGS. 5 and 6.

FIGS. 5 and 6 plot the results of analysis. FIG. 5 is a graph plotting the distribution of displacements of the fundamental wave of the thickness longitudinal vibration in a Y direction in each of the piezoelectric resonator device of the first preferred embodiment and the comparative piezoelectric resonator device. FIG. 6 is a graph plotting the distribution of displacements of the third overtone of the thickness longitudinal vibration in a Y direction in each of the piezoelectric resonator device of the first preferred embodiment and the comparative piezoelectric resonator device. The Y direction refers to the direction of the minor axis of the elliptical first vibrating electrode 4, i.e., the direction of the shorter side of the piezoelectric substrate 3 as shown in FIG. 7. In the circular electrode, the Y direction refers to the direction of the shorter side of the piezoelectric substrate.

When the first and second vibrating electrodes are changed in shape from circular to elliptical or substantially elliptical, the displacement of the fundamental wave of the thickness longitudinal vibration becomes large near or at a point of about ±0.4 mm. In the case of the circular vibrating electrode, the displacement at the same position is small, and the effectiveness of the encapsulation section formed of the adhesive layer for suppressing the fundamental wave is small. In contrast, the piezoelectric resonator component 1 of the first preferred embodiment results in a large displacement near or at a point of about ±0.4 in the fundamental wave of the thickness longitudinal vibration. The encapsulation section effectively suppressed the fundamental wave.

FIG. 6 shows that the third overtone of the thickness longitudinal vibration creates no significant difference between the circular vibrating electrode and the substantially elliptical vibrating electrode.

As clear from FIGS. 5 and 6, the encapsulation section, more specifically, the adhesive layers 8 and 10, suppresses the fundamental wave of the thickness longitudinal vibration traveling in the direction of the Y axis in the first and second vibrating electrodes having the substantially elliptical shape in the first preferred embodiment of the present invention.

Figure 8:
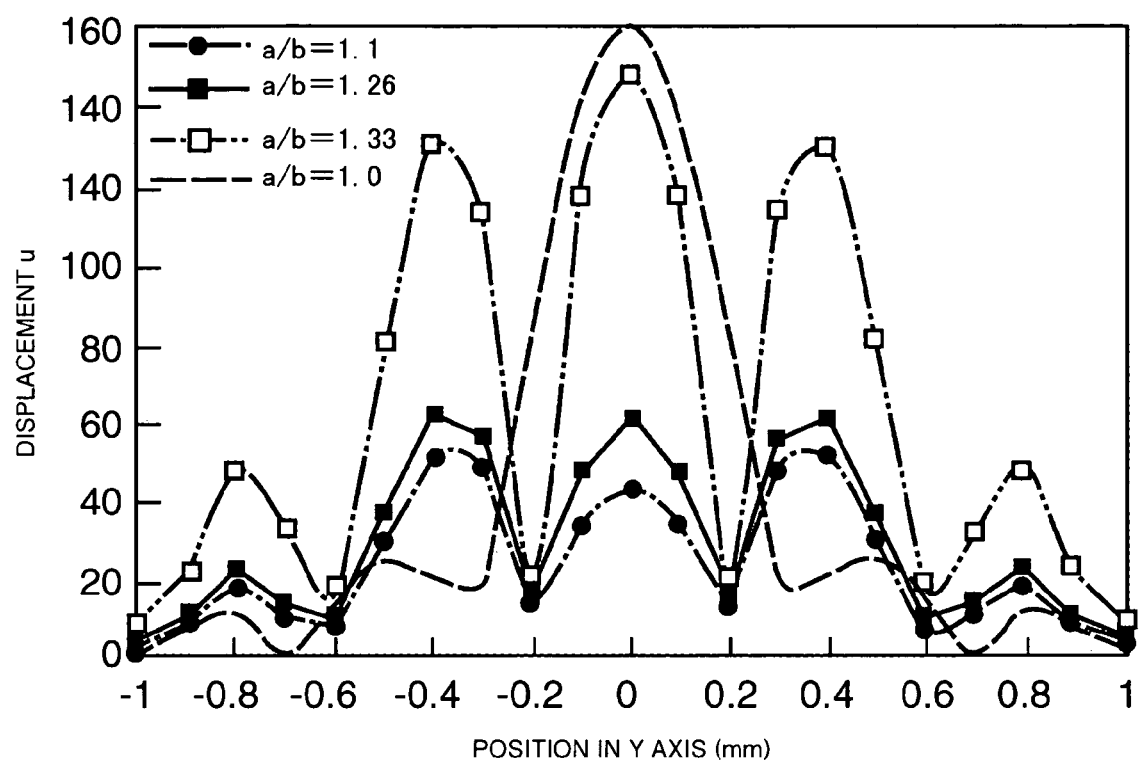
FIG. 8 is a graph plotting the distribution of displacements of the fundamental wave of the thickness longitudinal vibration in the Y axis direction with the flattening ratio of the vibrating electrode changed.

Tests were conducted to examine how the effect of suppressing the fundamental wave changes in response to a change in the substantially elliptical shape of the vibrating electrode. FIG. 8 is a graph plotting the distribution of displacements of the fundamental wave of the thickness longitudinal vibration in the Y axis direction with the flattening ratios of "a/b" of the vibrating electrode at 1 (in the circular shape), and about 1.10, about 1.26, and about 1.33 (in the substantially elliptical shapes). The flattening ratio is changed from about 1.0 to about 1.33 as shown in FIG. 8. The displacement is maximized near or at a point of Y=about ±0.4 mm as the flattening ratio approaches approximately 1.33.

Figure 9:
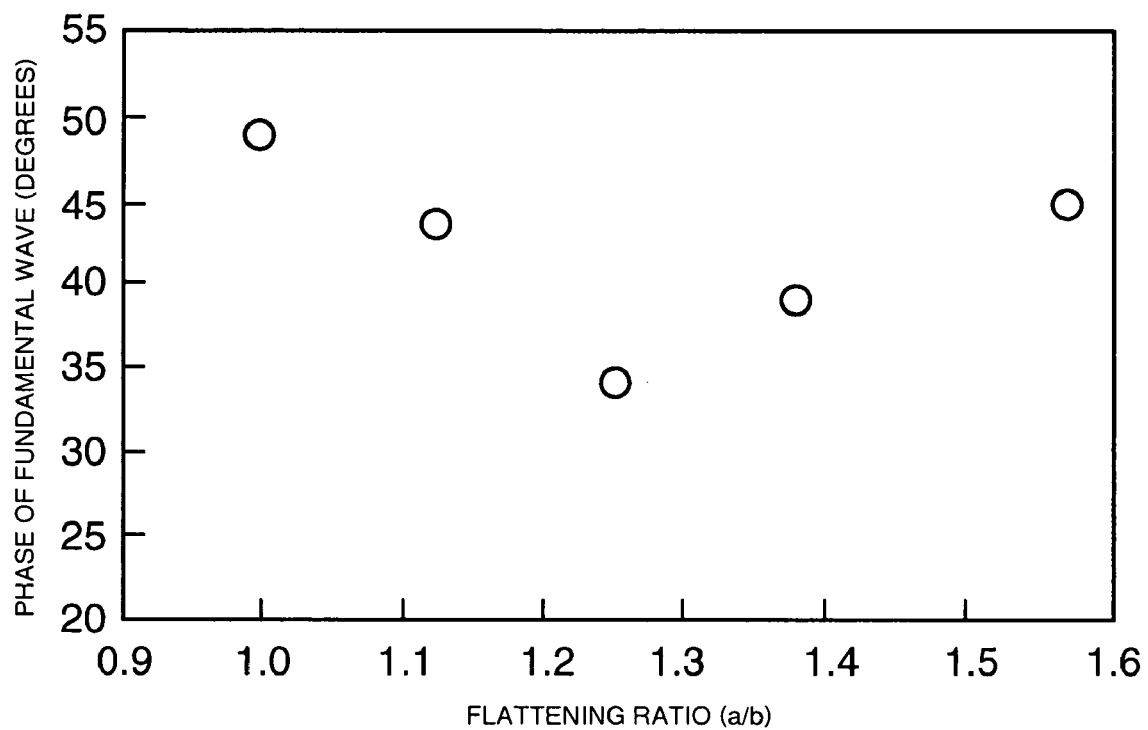
FIG. 9 is a graph plotting change in the maximum value of the phase of the fundamental wave of the thickness longitudinal vibration with the flattening ratio changed.

FIG. 9 is a graph plotting change in the maximum value of the phase of the fundamental wave of the thickness longitudinal vibration with the flattening ratio changed and with the area S of the vibrating electrode at approximately 0.62 mm$^2$. As shown, the phase is minimized within a range of the flattening ratio "a/b" from about 1.2 to about 1.3. In other words, the effect of suppressing the fundamental wave is maximized within the flattening ratio range from about 1.2 to about 1.3. More specifically, the maximum value of the phase of the fundamental wave of the thickness longitudinal vibration is below 40 degrees with the flattening ratio falling within a range of from about 1.2 to about 1.4 in contrast to the circular electrode, i.e., with the flattening ratio equal to about 1.0. In the first preferred embodiment of the present invention, the flattening ratio "a/b" of the first and second vibrating electrodes having the substantially elliptical shape is within a range of from about 1.2 to about 1.45. The fundamental wave functioning as a spurious is effectively suppressed when the third overtone of the thickness longitudinal vibration is used. Good resonance characteristics are thus achieved.

Figure 10:
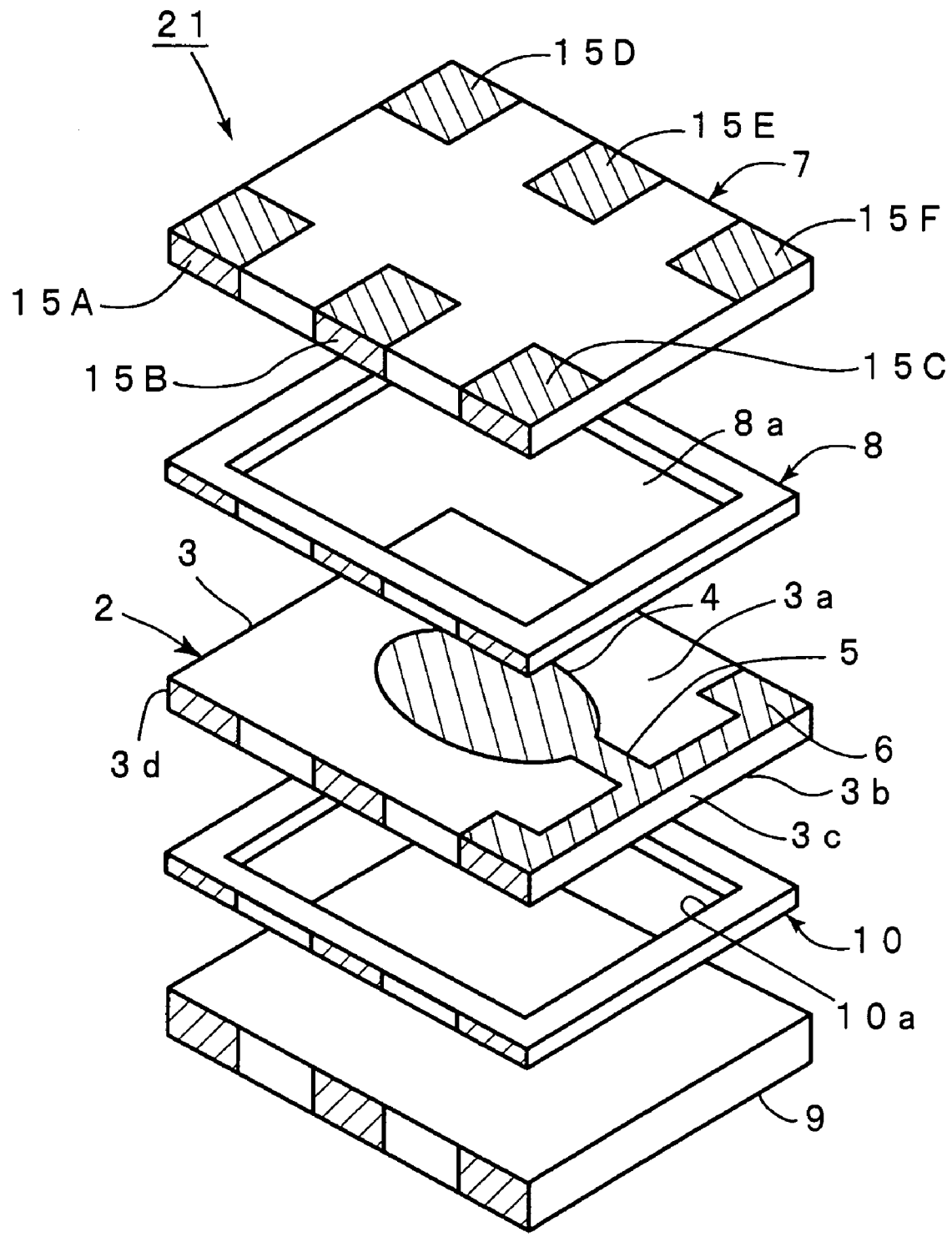
FIG. 10 is an exploded perspective view illustrating a piezoelectric resonator component in accordance with a modification of the first preferred embodiment of the present invention.

FIG. 10 is an exploded perspective view illustrating a piezoelectric resonator component 21 of a modification of the first preferred embodiment of the present invention. The piezoelectric resonator component 21 of the modification of the first preferred embodiment has the same structure as the piezoelectric resonator component 1 of the first preferred embodiment except that no damping member 11 is used. Like elements are designated with like reference numerals, and the discussion thereof is omitted. As in the piezoelectric resonator component 21, the damping member 11 may be dispensed with, although the use of the damping member 11 helps to suppress the fundamental wave of the thickness longitudinal vibration more effectively.

Figure 11:
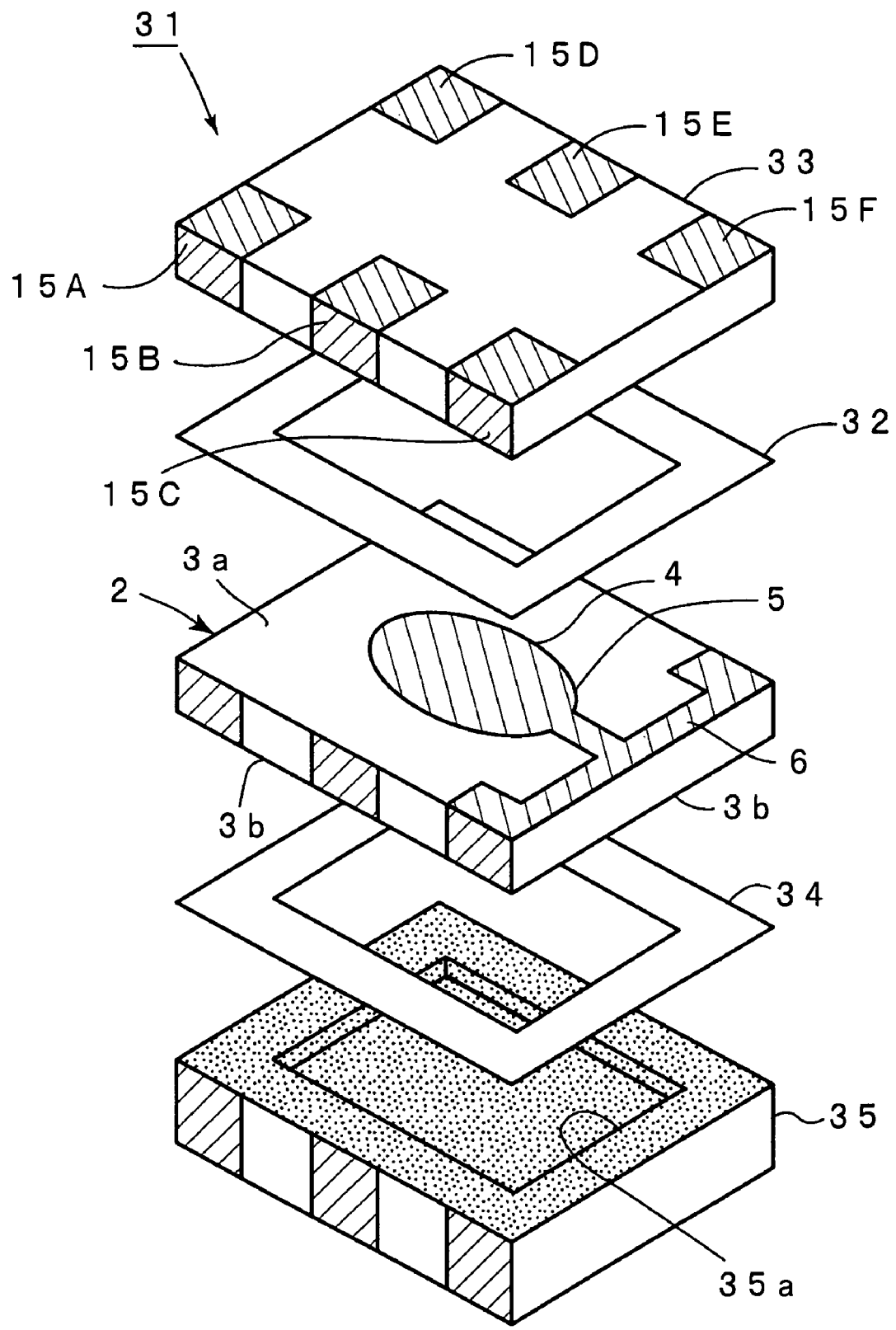
FIG. 11 is an exploded perspective view illustrating a piezoelectric resonator component in accordance with a second preferred embodiment of the present invention.
Figure 12:
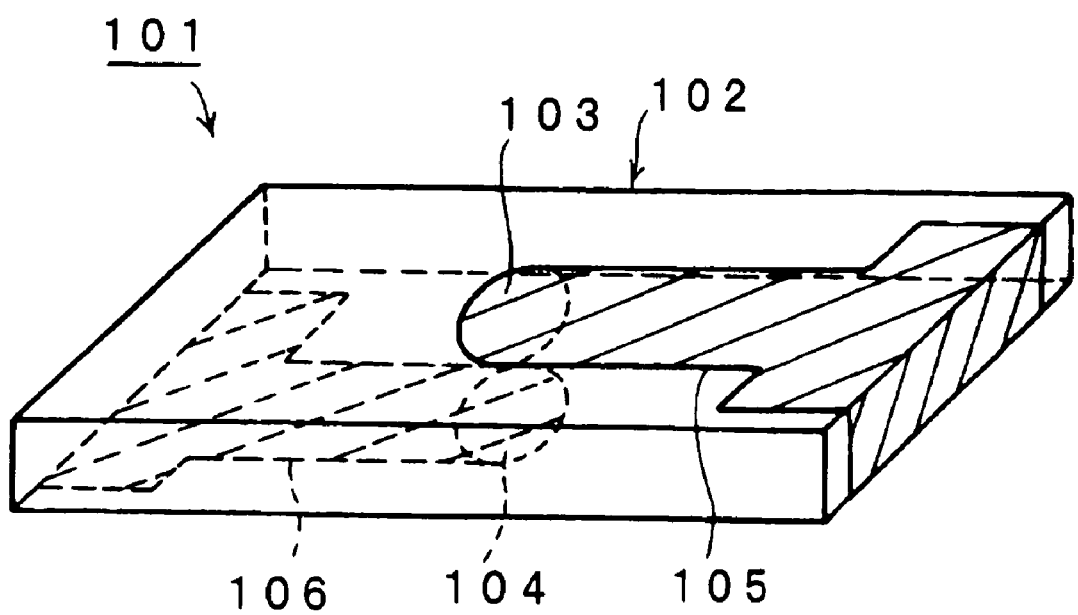
FIG. 12 is a perspective view illustrating a known energy trap type piezoelectric resonator.
Figure 13:
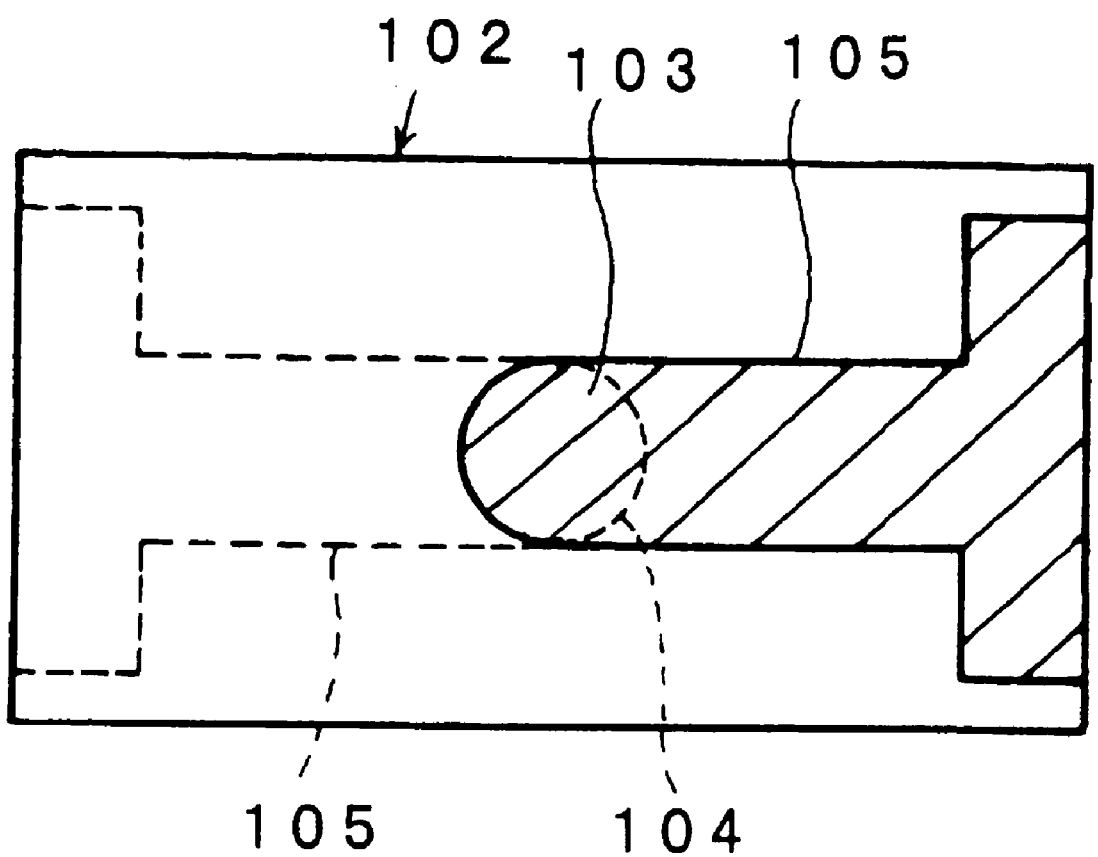
FIG. 13 is a plan view illustrating the known energy trap type piezoelectric resonator of FIG. 12.
Figure 14:
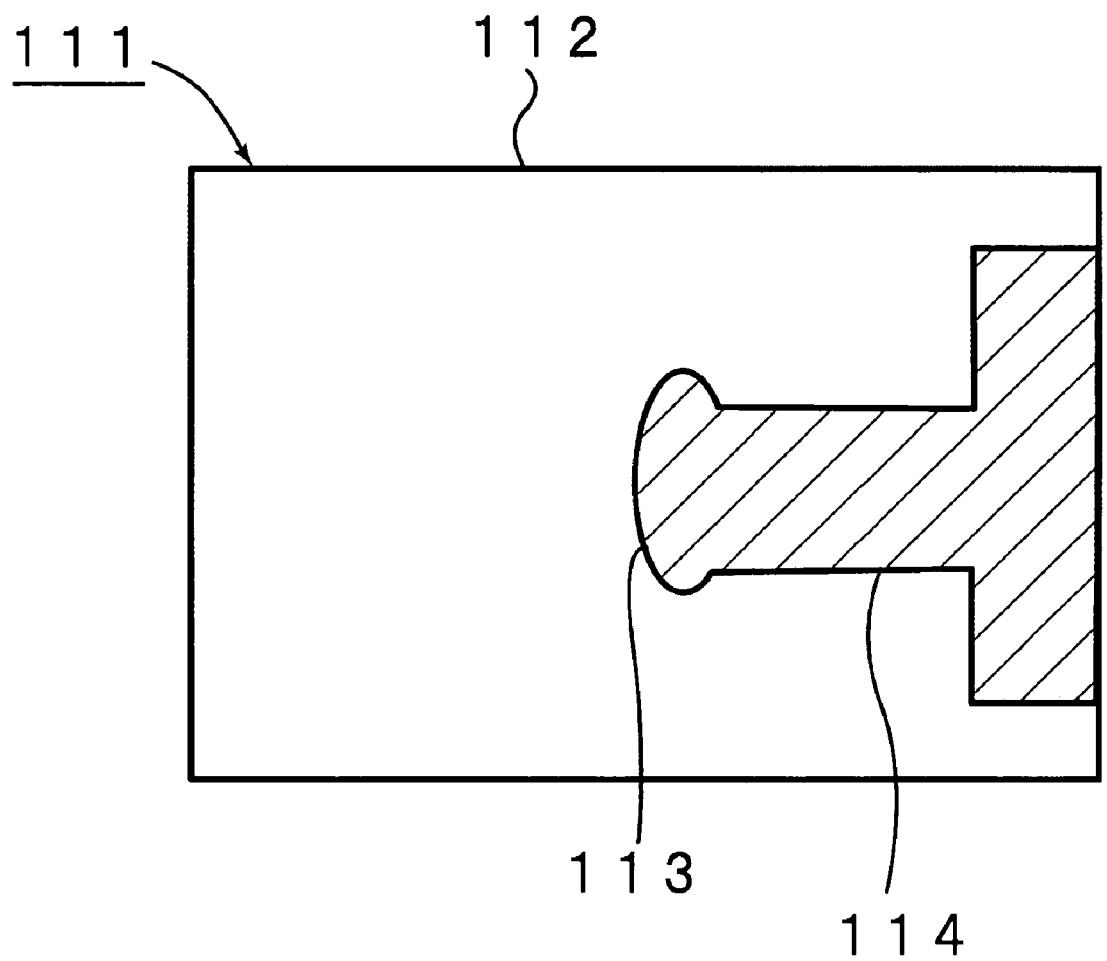
FIG. 14 is a plan view illustrating another known energy trap type piezoelectric resonator.

FIG. 11 is an exploded perspective view illustrating a piezoelectric resonator component 31 in accordance with a second preferred embodiment of the present invention.

The piezoelectric resonator component 31 preferably has the same structure as the piezoelectric resonator component 1 of the first preferred embodiment except that the first casing substrates 7 and 9 are replaced with first and second casing substrates 33 and 35 having recesses on the surfaces thereof laminated onto the energy trap type piezoelectric resonator 2 and that the adhesive layers for forming the cavities is replaced with thin adhesive layers 32 and 34.

As shown in FIG. 11, the first casing substrate 33 is bonded on the first major surface of the piezoelectric resonator 2 with a film-like adhesive layer 32 interposed therebetween. The second casing substrate 35 is bonded on the second major surface 3b of the piezoelectric resonator 2 with the film-like adhesive layer 34 interposed therebetween. The second casing substrate 35 has a top recess 35a. The top recess 35a is provided to form a cavity that keeps the vibration of the vibrating section free from restriction. The first casing substrate 33 has also, on the bottom thereof, a recess (not shown).

The cavities that allow the vibrating section to vibrate are formed by the casing substrates 33 and 35 having the recesses thereof in the energy trap type piezoelectric resonator component of the second preferred embodiment of the present invention. The film-like adhesive layers 32 and 34 may be thin. Instead of the film-like adhesive layers, an adhesive agent may be applied in the form of a frame-like structure.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An energy trap piezoelectric resonator component utilizing third overtone of a thickness longitudinal vibration, comprising:
   a piezoelectric substrate having first and second major surfaces and polarized in a direction of thickness between the first and second major surfaces;
   a first vibrating electrode disposed on a portion of the first major surface of the piezoelectric substrate; and
   a second vibrating electrode disposed on a portion of the second major surface of the piezoelectric substrate and facing the first vibrating electrode with the piezoelectric substrate interposed therebetween; wherein
   each of the first and second vibrating electrodes has a substantially elliptical shape, and wherein a flattening ratio a/b is within a range of about 1.2 to about 1.45, where a represents the major axis diameter of the substantially elliptical shape and b represents the minor axis diameter of the substantially elliptical shape; and
   first and second casing substrates respectively laminated on top and bottom surfaces of the piezoelectric substrate, wherein vibrating cavities are provided between the first vibrating electrode and the first casing substrate and between the second vibrating electrode and the second casing substrate.

2. An energy trap piezoelectric resonator component according to claim 1, wherein each of the first and second major surfaces has a substantially rectangular shape defined by a pair of longer sides and a pair of shorter sides and the minor axis of the substantially elliptical shape of each of the first and second vibrating electrodes is substantially in parallel with the shorter side of the piezoelectric substrate.

3. An energy trap piezoelectric resonator component according to claim 2, wherein the first vibrating electrode, the first extension electrode, the second vibrating electrode, and the second extension electrode are made of an alloy containing nickel, chromium, and silver.

4. An energy trap piezoelectric resonator component according to claim 1, further comprising:
   a first extension electrode connected to the first vibrating electrode on the first major surface of the piezoelectric substrate and extending toward the periphery of the first major surface; and
   a second extension electrode connected to the second vibrating electrode on the second major surface of the piezoelectric substrate and extending toward the periphery of the second major surface; wherein
   a line width of each of the first and second extension electrodes is narrower than a minor axis diameter of each of the first and second vibrating electrodes.

5. An energy trap piezoelectric resonator component according to claim 1, wherein the first and second casing substrates have recesses on the respective surfaces thereof facing the energy trap piezoelectric resonator to ensure that the vibration of a vibrating section having the first and second vibrating electrodes facing each other is not restricted.

6. An energy trap piezoelectric resonator component according to claim 1, further comprising a first adhesive layer between the first casing substrate and the piezoelectric resonator, and a second adhesive layer between the second casing substrate and the piezoelectric resonator, wherein the first and second adhesive layers respectively bond the first and second casing substrates to the piezoelectric resonator, and each of the first and second adhesive layers has a substantially rectangular frame and a vibrating section where the first and second vibrating electrodes face each other is arranged within openings of the substantially rectangular frames.

7. An energy trap piezoelectric resonator component according to claim 6, further comprising a frame-shaped damping member arranged on the periphery of at least one of the major surfaces of the piezoelectric substrate, wherein the damping member is made of a material that has a higher elastic modulus than that of the first and second adhesive layers.

8. An energy trap piezoelectric resonator component according to claim 7, wherein the damping member and the adhesive layer have a total thickness of about $\lambda/4$ where $\lambda$ represents the wavelength of the fundamental wave of the thickness longitudinal vibration.

9. An energy trap piezoelectric resonator component according to claim 1, further comprising a frame-shaped damping member arranged on the periphery of at least one of the major surfaces of the piezoelectric substrate.

10. An energy trap piezoelectric resonator component according to claim 9, wherein the damping member is made of an epoxy resin.

11. An energy trap piezoelectric resonator component according to claim 9, wherein the damping member has a thickness of about 40 $\mu$m or more.

12. An energy trap piezoelectric resonator component according to claim 1, wherein the first and second casing substrates are made of one of an insulating ceramic and a synthetic resin.

* * * * *